US008845915B2

(12) United States Patent
Ono et al.

(10) Patent No.: US 8,845,915 B2
(45) Date of Patent: Sep. 30, 2014

(54) ABRADING AGENT AND ABRADING METHOD

(75) Inventors: Hiroshi Ono, Hitachi (JP); Takashi Shinoda, Hitachi (JP); Yuuhei Okada, Hitachi (JP)

(73) Assignee: Hitachi Chemical Company, Ltd., Tokyo (JP)

( * ) Notice: Subject to any disclaimer, the term of this patent is extended or adjusted under 35 U.S.C. 154(b) by 79 days.

(21) Appl. No.: 13/201,518

(22) PCT Filed: Jan. 22, 2010

(86) PCT No.: PCT/JP2010/050806
§ 371 (c)(1),
(2), (4) Date: Aug. 15, 2011

(87) PCT Pub. No.: WO2010/092865
PCT Pub. Date: Aug. 19, 2010

(65) Prior Publication Data
US 2011/0300778 A1    Dec. 8, 2011

(30) Foreign Application Priority Data

Feb. 16, 2009  (JP) ................................. 2009-032635

(51) Int. Cl.
| | | |
|---|---|---|
| C03C 15/00 | (2006.01) | |
| H01L 21/321 | (2006.01) | |
| C09G 1/02 | (2006.01) | |
| H01L 21/768 | (2006.01) | |
| C09K 3/14 | (2006.01) | |

(52) U.S. Cl.
CPC .............. *H01L 21/3212* (2013.01); *C09G 1/02* (2013.01); *H01L 21/7684* (2013.01); *H01L 21/76898* (2013.01); *C09K 3/1463* (2013.01)
USPC ................ 216/89; 216/37; 216/67; 252/79.1; 252/79.2; 252/79.3; 252/79.4

(58) Field of Classification Search
USPC ...................... 216/37, 67, 89; 252/79.1–79.4
See application file for complete search history.

(56) References Cited

U.S. PATENT DOCUMENTS

| | | |
|---|---|---|
| 6,428,721 B1 | 8/2002 | Ina et al. |
| 6,551,935 B1 | 4/2003 | Sinha et al. |

(Continued)

FOREIGN PATENT DOCUMENTS

| | | |
|---|---|---|
| CN | 1312843 A | 9/2001 |
| CN | 1680511 A | 10/2005 |

(Continued)

OTHER PUBLICATIONS

Notification of Transmittal of Translation of the International Preliminary Report on Patentability ( Form PCT/ IB/338) of International Application No. PCT/JP2010/050806 mailed Sep. 22, 2011 with Forms PCT/IB/373 and PCT/ISA/237.

(Continued)

*Primary Examiner* — Nadine Norton
*Assistant Examiner* — Maki Angadi
(74) *Attorney, Agent, or Firm* — Westerman, Hattori, Daniels & Adrian, LLP

(57) ABSTRACT

A polishing agent which comprises a composition containing an inorganic acid, an amino acid, a protective film-forming agent, an abrasive, an oxidizing agent, an organic acid and water, adjusted to a pH of 1.5-4, wherein the amount of potassium hydroxide required to raise the pH of the composition without the organic acid to 4 is at least 0.10 mol with respect to 1 kg of the composition without the organic acid, and the organic acid contains at least two carboxyl groups, wherein the logarithm of the inverse of the first acid dissociation constant (pKa1) is no greater than 3.

13 Claims, 3 Drawing Sheets

(56) References Cited

U.S. PATENT DOCUMENTS

| | | | |
|---|---|---|---|
| 6,803,353 | B2 | 10/2004 | Martyak et al. |
| 7,128,825 | B2 | 10/2006 | Liu et al. |
| 7,160,432 | B2 | 1/2007 | Liu et al. |
| 7,186,653 | B2 * | 3/2007 | Jha et al. ............ 438/692 |
| 7,220,676 | B2 * | 5/2007 | Hagihara et al. ....... 438/692 |
| 7,367,870 | B2 | 5/2008 | Kurata et al. |
| 8,241,516 | B2 * | 8/2012 | Fujii et al. ............ 216/89 |
| 8,491,807 | B2 | 7/2013 | Uchida et al. |
| 2001/0039766 | A1 | 11/2001 | Hattori et al. |
| 2002/0098701 | A1 | 7/2002 | Hasegawa |
| 2004/0108302 | A1 | 6/2004 | Liu et al. |
| 2004/0159050 | A1 | 8/2004 | Pasqualoni et al. |
| 2004/0175942 | A1 | 9/2004 | Chang et al. |
| 2004/0229461 | A1 | 11/2004 | Darsillo et al. |
| 2004/0248412 | A1 | 12/2004 | Liu et al. |
| 2005/0090104 | A1 | 4/2005 | Yang et al. |
| 2005/0199589 | A1 | 9/2005 | Hirabayashi et al. |
| 2007/0082456 | A1 | 4/2007 | Uotani et al. |
| 2007/0128872 | A1 | 6/2007 | Itoh et al. |
| 2008/0237535 | A1 | 10/2008 | Maejima et al. |
| 2008/0311750 | A1 | 12/2008 | Izumi et al. |
| 2009/0008600 | A1 | 1/2009 | Jia et al. |
| 2009/0140199 | A1 | 6/2009 | Kamiya et al. |
| 2009/0223136 | A1 | 9/2009 | Nakajo et al. |
| 2010/0197201 | A1 | 8/2010 | Nomura et al. |
| 2010/0248480 | A1 | 9/2010 | Darsillo et al. |
| 2010/0301010 | A1 | 12/2010 | Lin et al. |
| 2011/0130000 | A1 | 6/2011 | Park et al. |
| 2012/0160804 | A1 | 6/2012 | Ono et al. |

FOREIGN PATENT DOCUMENTS

| | | | |
|---|---|---|---|
| CN | 1842577 | A | 10/2006 |
| JP | 02-278822 | A | 11/1990 |
| JP | 2003-124160 | A | 4/2003 |
| JP | 2006-302968 | A | 11/2006 |
| JP | 2007-103485 | A | 4/2007 |
| JP | 2007-150263 | A | 6/2007 |
| JP | 2007-150264 | A | 6/2007 |
| JP | 2008-186898 | A | 8/2008 |
| JP | 4164941 | B2 | 10/2008 |
| JP | 2008-270826 | A | 11/2008 |
| KR | 20080069537 | A | 7/2008 |
| TW | 200427827 | A | 12/2004 |
| WO | 2004/063301 | A1 | 7/2004 |

OTHER PUBLICATIONS

Notification of Transmittal of Translation of the International Preliminary Report on Patentability (Form PCT/IB/338) of International Application No. PCT/JP2010/052069 mailed Sep. 22, 2011 with Forms PCT/IB/373 and PCT/ISA/237.

International Search Report for PCT/JP2010/050806, mailing date of Apr. 27, 2010.

US Office Action dated Jul. 18, 2012, issued in corresponding U.S. Appl. No. 13/201,529.

US Office Action dated Oct. 17, 2012, issued in corresponding U.S. Appl. No. 13/201,529.

Chinese Office Action dated Feb. 21, 2013, issued in corresponding Chinese Patent Application No. 201080007580.7 (7 pages).

US Office Action dated Mar. 1, 2013, issued in corresponding U.S. Appl. No. 13/201,529.

US Office Action dated Aug. 14, 2013, issued in related U.S. Appl. No. 13/201,529 (14 pages).

U.S. Non-Final Office Action dated Feb. 27, 2014, issued in related U.S. Appl. No. 13/412,893 (16 pages).

Japanese Notice of Allowance dated Jan. 7, 2014, issued in corresponding Japanese Patent Application No. 2011-257827 (1 page).

Chinese Office Action dated Jan. 10, 2014, issued in corresponding Chinese Patent Application No. 201210135608.6 (10 pages).

* cited by examiner (a)

(b)

(c)

(a)

(b)

(c)

(a)

(b)

(c)

ABRADING AGENT AND ABRADING METHOD

TECHNICAL FIELD

The invention relates to a polishing agent, and particularly a polishing agent for copper polishing with high polishing speed, that is especially suitable for use in chemical mechanical polishing (CMP) steps, and to a polishing method using it.

BACKGROUND ART

The use of copper alloys as wiring material substitutes for conventional aluminum alloys is advancing, with the aim of increasing the performance of LSI devices. Aluminum alloy wirings have been subjected to micromachining primarily by dry etching methods, but the same methods are poorly suitable for application to copper alloy wirings.

The "damascene method" has therefore been largely employed for micromachining of copper alloy wirings, in which method a thin-film of a copper alloy is accumulated and embedded on an insulating film having pre-formed furrows, and the copper alloy thin-film on sections other than the furrows is removed by CMP to form embedded wiring (see Patent document 1).

The common method of CMP for metals such as copper alloys involves attaching an abrasive pad onto a circular polishing plate (platen), dipping the abrasive pad surface into a polishing agent for metals, pressing the metal film-formed surface of a substrate against it, rotating the polishing platen with a prescribed pressure (hereunder referred to as "polishing pressure") being applied from the back side, and removing the metal film on the heights by mechanical friction between the polishing agent and the heights of the metal film.

The polishing agent used for CMP usually comprises an oxidizing agent and an abrasive, with further addition of a metal oxide solubilizer or protective film-forming agent as necessary.

In CMP employing such a polishing agent, presumably the metal film surface is first oxidized by the oxidizing agent and the oxidation layer is shaved by the abrasive, resulting in polishing of the metal film. Here, since the oxidation layer on the metal surface in the recesses does not significantly contact with the abrasive pad and is not reached by the shaving effect of the abrasive, the metal layer on the heights is removed as CMP proceeds, thus flattening the substrate surface (see Non-patent document 1, for example).

When the damascene method is applied for common manufacturing of an LSI, the film thickness of the copper alloy used is about 1 μm (1000 nm), and a polishing agent with a polishing speed of about 0.5 μm/min (500 nm/min) is used (see Patent document 2, for example).

In recent years, however, CMP treatment of copper is being applied for manufacture of high performance microcircuit boards such as package boards, and also in the formation of Through Silicon Vias (TSV) that have become an object of interest in new mounting methods. TSVs, however, require polishing of metals (copper alloys) with film thicknesses of 5 μm and greater, and sometimes 10 μm and greater, and therefore the polishing speeds achieved with conventional LSI polishing agents are inadequate, and polishing agents that allow polishing at higher polishing speeds are desired.

Patent document 3 thus discloses a polishing agent which allows polishing of copper alloy films at polishing speeds that are higher than the prior art (about 2.2-2.9 μm/min).

CITATION LIST

Patent Literature

[Patent document 1] Japanese Unexamined Patent Application Publication HEI No. 2-278822
[Patent document 2] Japanese Unexamined Patent Application Publication No. 2003-124160
[Patent document 3] Japanese Unexamined Patent Application Publication No. 2007-150263

SUMMARY OF INVENTION

Technical Problem

The polishing agent described in Patent document 3 can be applied as a polishing agent for TSVs, but as improvement in productivity is a goal, there exists a demand for a polishing agent that allows polishing of copper alloy films with a higher polishing speed.

It is therefore an object of the present invention to provide a polishing agent that allows smooth polishing of copper films (including "copper alloy films", same hereunder) at high polishing speed, and that allows rapid polishing treatment and can ensure sufficient productivity even for purposes that require polishing of thick metal films on high performance circuit boards or TSVs, as well as a polishing method using the same.

Solution to Problem

The present invention provides a polishing agent which comprises a composition containing an inorganic acid, an amino acid, a protective film-forming agent, an abrasive, an oxidizing agent, an organic acid and water, adjusted to a pH of 1.5-4, wherein the amount of potassium hydroxide required to raise the pH of the composition without the organic acid (also without the pH regulator, when the composition contains a pH regulator such as ammonia water) to 4 is at least 0.10 mol with respect to 1 kg of the composition without the organic acid, the organic acid contains at least two carboxyl groups, and the logarithm of the inverse of the first acid dissociation constant (pKa1) is no greater than 3.

With such a polishing agent, it is possible to achieve smooth polishing of copper films at high polishing speed, and to accomplish rapid polishing treatment to ensure sufficient productivity even for purposes that require polishing of thick metal films on high performance circuit boards or TSVs.

For the "pKa1" value, reference may be made to Kagaku Binran, Kisohen II (5th Revision, Maruzen). For adjustment of the pH to 1.5-4, a pH regulator such as ammonia may be added, or the contents of the components in the composition may be adjusted for a pH of 1.5-4.

The organic acid is preferably one or more organic acids selected from the group consisting of oxalic acid, maleic acid and malonic acid, from the viewpoint of obtaining a high effect in increasing polishing speed.

The inorganic acid is preferably at least one selected from among sulfuric acid and phosphoric acid, more preferably one including sulfuric acid and phosphoric acid and even more preferably one consisting of sulfuric acid and phosphoric acid, from the viewpoint of allowing further reduction in the surface roughness of the copper film. The pKa1 of the amino acid is preferably 2-3 from the viewpoint of easier adjustment of the pH of the polishing agent to 1.5-4.

From the viewpoint of achieving further increased polishing speed, the protective film-forming agent is preferably at least one protective film-forming agent selected from the group consisting of benzotriazole and its derivatives.

The abrasive is preferably colloidal silica and/or colloidal alumina having a mean particle size of no greater than 100 nm, for particularly excellent polishing properties.

The oxidizing agent is preferably at least one oxidizing agent selected from the group consisting of hydrogen peroxide, persulfuric acid and persulfuric acid salts, for an especially high polishing-promoting effect.

The invention further provides a polishing method that comprises a lamination step in which a copper-containing metal film is laminated on a substrate, and a polishing step in which a polishing agent of the invention is used for polishing of the copper-containing metal film to remove at least a portion of the metal film. Since this polishing method employs a polishing agent of the invention, it allows both a high polishing speed and smooth polishing to be achieved, and can therefore improve productivity while also increasing product yield.

Since a high polishing speed and smooth polishing are both achieved by this polishing method, it can be suitably applied for metal films wherein the maximum thickness of the metal film is 5 μm or greater, and especially 10 μm or greater. The "maximum thickness of the metal film" is the maximum thickness of the metal film at the section to be polished, and it does not include the thickness of the metal film in the recesses when the metal film is formed on recesses of the substrate.

Moreover, since both a high polishing speed and smooth polishing can be achieved by the polishing method, it is possible to obtain a polishing speed of 5 μm/min or greater for polishing of metal films in polishing steps.

Unless otherwise specified, the term "copper" used throughout the present specification also encompasses copper-containing metals (such as copper alloys), while the term "copper-containing metal film" refers to metal films composed of copper, copper-containing metal films (such as copper alloy films) and laminated films of these metal films with other metals.

Advantageous Effects of Invention

According to the polishing agent of the invention, the surface roughness after polishing is kept at a low level while an exceptionally higher polishing speed is exhibited for copper than with ordinary polishing agents. In particular, the polishing agent of the invention allows excellent polishing properties to be obtained, for a polishing speed of at least 4 μm/min for copper, and it is therefore optimal for use in polishing of large amounts of copper in a short time, such as use in high performance circuit boards, use in TSVs and the like.

DESCRIPTION OF EMBODIMENTS

Figure 1:
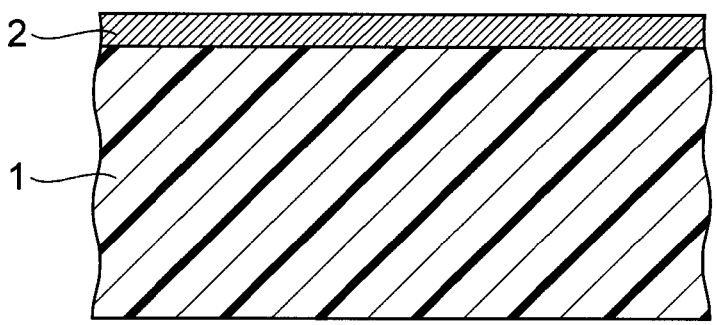
FIGS. 1(a)-(c) are first process drawings that illustrate a method of using a polishing agent of the invention for VIA-LAST.
Figure 1:
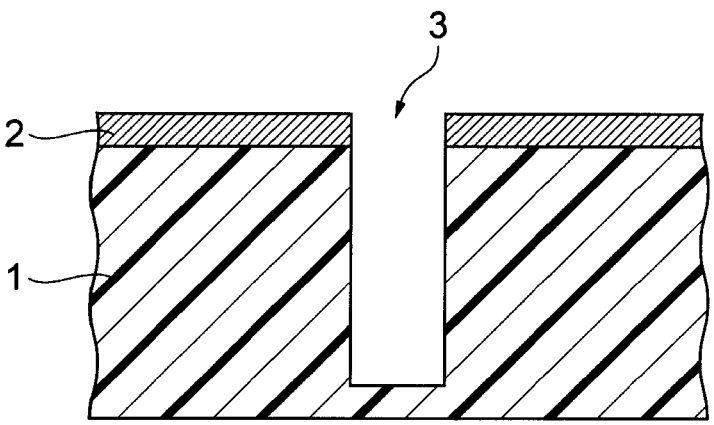
Figure 1:
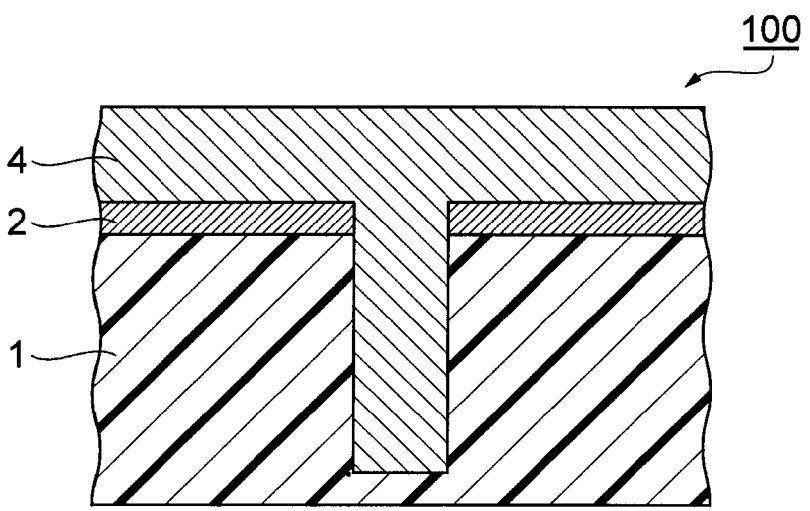

The polishing agent of the invention is a polishing agent having a composition comprising an inorganic acid, an amino acid, a protective film-forming agent, an abrasive, an oxidizing agent, an organic acid and water, with the pH adjusted to 1.5-4. This will now be explained in detail.

Adding either the inorganic acid or organic acid alone to the polishing agent will result in some increase in polishing speed, and raising the addition amount of either will tend to further increase the polishing speed. However, using a combination of an inorganic acid with a specific organic acid will allow a high polishing speed to be obtained with a smaller amount of addition. In other words, the polishing speed can be more effectively increased in that the efficiency in increasing polishing speed for the amount of addition will be higher.

While the reason for this effect obtained by further addition of a specific organic acid to the inorganic acid is not fully understood, the present inventors conjecture as follows. Specifically, it is believed that the action of the protective film-forming agent and the inorganic acid forms a "reaction layer" comprising the protective film-forming agent and copper ion on the copper surface, so that as its polishing proceeds, chelation of the specific organic acid that is added by copper ion renders the reaction layer more removable, thus promoting polishing The pH of the polishing agent of the invention is adjusted to be 1.5-4. This can increase the polishing speed for copper by CMP and prevent corrosion of the copper film. The pH of the polishing agent is more preferably 2-3. At lower than pH 1.5, the surface roughness of the copper film will increase, while at higher than pH 4 the polishing speed by CMP will be reduced, so that a practical polishing agent cannot be obtained. The pH of the polishing agent may be adjusted by addition of inorganic acids, organic acids and amino acids, and if desired it may be adjusted by addition of a pH regulator as described below.

(pH Regulator)

An alkaline component may be added as a pH regulator to the polishing agent of this embodiment, for adjustment of the pH. Examples of such alkaline components include ammonia, sodium hydroxide and tetramethylammonium hydroxide. Naturally, addition of a pH regulator is unnecessary if the pH of the polishing agent is already within the range of 1.5-4 without addition a pH regulator.

The pH of the polishing agent can be measured with a pH meter (for example, a Model PH81 by Yokogawa Electric Corp.). The pH meter is calibrated at 2 points using standard buffer (phthalate pH buffer: pH 4.01 (25° C.), neutral phosphate pH buffer: pH 6.86 (25° C.)). Then an electrode is placed in the polishing agent, and the value upon stabilization after an elapse of 2 minutes or more is adopted.

(Organic Acid)

The organic acid is an organic acid containing at least two carboxyl groups and having a pKa1 value of no greater than 3. Such an organic acid is considered to be effective for increasing the polishing speed by efficient chelation with copper ions in the aforementioned pH range.

There are no particular restrictions on the organic acid having at least two carboxyl groups and a pKa1 value of no greater than 3 so long as it dissolves even slightly in water, and specific examples include oxalic acid, malonic acid, maleic acid, fumaric acid, tartaric acid and citric acid. Preferred from the viewpoint of a greater effect in increasing polishing speed are oxalic acid, maleic acid and malonic acid. These may be used alone or in combinations of two or more.

The amount of organic acid added is preferably at least 0.05 wt % and more preferably at least 0.1 wt % with respect to the total polishing agent, from the viewpoint of more easily obtaining an effect in increasing polishing speed. There is no particular upper limit, but there tends to be no further increase in polishing speed with addition above a certain amount. From this viewpoint, the upper limit is preferably no greater than 10 wt % and more preferably no greater than 5 wt %.

(Inorganic Acid)

Known inorganic acids may be used without any particular restrictions, and specific examples include hydrochloric acid, hydrobromic acid, hydroiodic acid, sulfuric acid and phosphoric acid. From the viewpoint of a greater effect in increasing polishing speed by CMP and reducing surface roughness of copper films, sulfuric acid, phosphoric acid, and mixtures of sulfuric acid and phosphoric acid are preferred. These may be used alone or in combinations of two or more.

(Amino Acid)

The amino acid is used for adjustment of the pH and dissolution of copper. There are no particular restrictions on the amino acid so long as it dissolves even slightly in water, and specific examples include glycine, alanine, valine, leucine, isoleucine, serine, threonine, cysteine, cystine, methionine, aspartic acid, glutamic acid, lysine, arginine, phenylalanine, tyrosine, histidine, tryptophan, proline and oxyproline. These may be used alone or in combinations of two or more.

Preferred among these amino acids are amino acids with pKa1 values of 2-3, from the viewpoint of facilitating adjustment of the pH of the polishing agent to 1.5-4. These include, among the compounds given as examples above, glycine, alanine, valine, leucine, isoleucine, serine, threonine, methionine, aspartic acid, glutamic acid, lysine, arginine and tryptophan. Glycine is most preferred among these for a greater effect in increasing polishing speed and for economy.

The amount of amino acid added is preferably at least 2.0 wt % and more preferably at least 3.0 wt % with respect to the total polishing agent, in order to more effectively exhibit a pH-adjusting effect. There is no particular upper limit, but there tends to be no further increase in pH-adjusting effect with addition above a certain amount. From this viewpoint, the upper limit is preferably no greater than 15 wt % and more preferably no greater than 10 wt %.

(Protective Film-Forming Agent)

A protective film-forming agent is a substance having an effect of forming a protective film on a copper surface. However, the protective film-forming agent is believed to form a "reaction layer" that is removed as polishing progresses, and it does not necessarily form a "protective film" to prevent polishing of copper.

Any conventionally known substance that is water-soluble in an amount effective for exhibiting such an effect may be used as the protective film-forming agent, without any particular restrictions, and specific examples thereof include nitrogen-containing compounds such as quinaldinic acid, anthranilic acid, salicylaldoxime, triazole compounds, imidazole compounds, pyrazole compounds and tetrazole compounds. Nitrogen-containing heterocyclic compounds are preferred among these, with triazole compounds being particularly preferred.

Examples of triazole compounds include triazole derivatives such as 1,2,3-triazole, 1,2,4-triazole and 3-amino-1H-1,2,4-triazole; and benzotriazole or benzotriazole derivatives such as 1-hydroxybenzotriazole, 1-dihydroxypropylbenzotriazole, 2,3-dicarboxypropylbenzotriazole, 4-hydroxybenzotriazole, 4-carboxyl(-1H-)benzotriazole, 4-carboxyl(-1H-)benzotriazolemethyl ester, 4-carboxyl(-1H-)benzotriazole butyl ester, 4-carboxyl(-1H-)benzotriazole octyl ester, 5-hexylbenzotriazole, [1,2,3-benzotriazolyl-1-methyl][1,2,4-triazolyl-1-methyl][2-ethylhexyl]amine, tolyltriazole, naphthotriazole, bis[(1-benzotriazolyl)methyl]phosphonic acid and 3-aminotriazole. Benzotriazole derivatives are more preferably used among these.

Examples of imidazole compounds include 2-methylimidazole, 2-ethylimidazole, 2-isopropylimidazole, 2-propylimidazole, 2-butylimidazole, 4-methylimidazole, 2,4-dimethylimidazole, 2-ethyl-4-methylimidazole, 2-undecylimidazole and 2-aminoimidazole.

Examples of pyrazole compounds include 3,5-dimethylpyrazole, 3-amino-5-methylpyrazole, 4-methylpyrazole and 3-amino-5-hydroxypyrazole.

Examples of tetrazole compounds include 1H-tetrazole, 5-amino-1H-tetrazole, 5-methyl-1H-tetrazole, 5-phenyl-1H-tetrazole and 1-(2-diaminoethyl)-5-mercaptotetrazole.

The amount of protective film-forming agent added is preferably 0.05 wt % and more preferably at least 0.1 wt % with respect to the total polishing agent, from the viewpoint of allowing the metal surface roughness to be further reduced. Also, from the viewpoint of excellent polishing speed, it is preferably no greater than 10 wt % and more preferably no greater than 5 wt %.

(Abrasive)

The abrasive is not particularly restricted, and specific examples include inorganic material abrasives such as silica, alumina, zirconia, ceria, titania and silicon carbide, and organic material abrasives such as polystyrene, polyacryl and polyvinyl chloride. Among these, silica and alumina are preferred for their satisfactory dispersion stability in polishing agents and their low frequency of polishing damage (scratches) generated by CMP, while colloidal silica and colloidal alumina are more preferred from the viewpoint of easy particle size control and excellence in terms of polishing properties. Colloidal silica can be produced, for example, by hydrolysis of silicon alkoxide or ion-exchange of sodium silicate, while colloidal alumina can be produced, for example, by hydrolysis of aluminum nitrate.

Also, from the viewpoint of polishing speed and low surface roughness after polishing, the mean particle size of the abrasive is preferably no greater than 100 nm, and colloidal silica or colloidal alumina having a mean particle size of no greater than 100 nm is more preferred. The term "mean particle size" used throughout the present specification refers to the D50 value (the median diameter of the volume distribution, or the cumulative median), obtained by measuring the polishing agent with a laser diffraction-type particle size distribution meter. The abrasives mentioned above may be used alone or in combinations of two or more.

The amount of abrasive added is preferably at least 0.1 wt % and more preferably at least 0.2 wt % with respect to the total polishing agent, from the viewpoint of obtaining a physical grinding effect and further increasing the polishing speed. Also, the upper limit is preferably no greater than 10 wt % and more preferably no greater than 5 wt %, because the polishing speed becomes saturated with large amounts, with no further increase in polishing speed being seen with addition in greater amounts, while aggregation of the abrasive and increased polishing damage can also result.

(Oxidizing Agent)

Any oxidizing agent may be used without any particular restrictions so long as it has an oxidizing effect on copper, and specific examples include hydrogen peroxide ($H_2O_2$), persulfuric acid, persulfuric acid salts such as ammonium persulfate and potassium persulfate, periodic acid, potassium periodate, and the like, among which hydrogen peroxide, persulfuric acid and persulfuric acid salts are preferred. These oxidizing agents may be used alone or in combinations of two or more.

The amount of oxidizing agent added is preferably at least 0.1 wt % and more preferably at least 0.2 wt % with respect to the total polishing agent, from the viewpoint of more easily obtaining sufficient polishing speed. Since addition in excess will either fail to increase the polishing speed or may instead lower it, the upper limit is preferably no greater than 20 wt % and more preferably no greater than 15 wt %.

(Inorganic Acid Neutralization Titration Equivalent)

The polishing agent of the invention is a pH buffer solution containing an inorganic acid. Inorganic acids are generally strong acids, and addition of a large amount will lower the pH, making it difficult to adjust the pH to the range of 1.5-4. Thus, addition of an amino acid to the inorganic acid can convert the polishing agent to a pH buffer solution with a pH of 1.5-4.

In the polishing agent of the invention, the inorganic acid is added in an amount such that the amount of potassium hydroxide necessary for pH increase to 4 in the composition comprising an inorganic acid, amino acid, protective film-forming agent, abrasive, oxidizing agent and water (the composition without the organic acid) (the neutralization titration equivalent of the inorganic acid by potassium hydroxide) is at least 0.10 mol per 1 kg of the composition without the organic acid.

The reason for specifying the neutralization titration equivalent of the inorganic acid by potassium hydroxide in the polishing agent of the invention is as follows. Specifically, the copper present in the metal film to be polished by the polishing agent of the invention dissolves in the polishing agent as cations, when the metal film is polished. If the polishing agent has a low amount of inorganic acid addition and no pH buffer action, presumably the hydrogen ions are consumed by dissolution of the copper, thus increasing the pH of the polishing agent and lowering the polishing speed. On the other hand, if a polishing agent used contains a sufficient amount of inorganic acid and has pH buffer action, pH increase is inhibited to allow stable polishing even if metal ions such as copper ions are dissolved in large amounts.

The amount of inorganic acid that is required in the polishing agent for this situation will vary somewhat depending on the polishing speed and the flow rate of the polishing agent during polishing, but it may be an amount corresponding to at least 0.10 mol/kg, more preferably at least 0.12 mol/kg, even more preferably at least 0.15 mol/kg and most preferably at least 0.20 mol/kg, as the neutralization titration equivalent by potassium hydroxide.

The neutralization titration equivalent of the polishing solution may be determined in the following manner. Specifically, a "test solution for measurement of neutralizing titer" is prepared, having the composition of the polishing solution without organic acids and the ammonia water solution (pH regulators). Next, 50 milliliters of the test solution is placed in an approximately 100 milliliter-volume beaker, aqueous potassium hydroxide at 20% concentration is added dropwise while stirring at 80 rpm with a stirrer, and the neutralization titration equivalent may be calculated from the amount of aqueous potassium hydroxide that has been added when the pH value reaches 4.0.

When the composition of the polishing solution is unknown, the composition and concentration of the polishing solution may be determined based on analysis by ion chromatography at a measuring precision of at least $10^{-8}$ g. Thus, the test solution may be prepared based on this measured value and the neutralizing titer measured.

It has been confirmed that high-speed polishing can be accomplished using the polishing agent described above, in case that, for example, the substrate is 8-inch (20.3 cm) disc-shaped and the polishing agent flow rate set to near 200 ml/min. The "neutralization titration equivalent of inorganic acid by potassium hydroxide" in the polishing agent of the invention is defined as the number of moles of potassium hydroxide required to increase the pH of the test solution to 4, when 1 kg of test solution is separately prepared having the composition of the polishing agent with the organic acids and pH regulators removed.

(Polishing Method)

The polishing method of the invention comprises a lamination step in which a copper-containing metal film is laminated on a substrate, and a polishing step in which the polishing agent of the invention is used for polishing of the copper-containing metal film to remove a portion of the metal film.

The polishing method employing a polishing agent of the invention has a much higher polishing speed for copper-containing metal films compared to conventional polishing methods, and for example, it is most suitably employed for polishing of thick metal films in processes for production of high performance microcircuit boards, such as LSIs or other package boards, and more specifically, it can be most suitably applied for polishing of substrates on which the thickness of the copper-containing metal film to be polished is 4 µm or greater.

A Through Silicon Via (TSV)-forming step may be mentioned as a step necessary for polishing of very thick metal films. Various methods have been proposed as methods of forming TSVs, and a specific method is VIA-LAST, wherein vias are formed after forming the element. A method of using a polishing agent of the invention in VIA-LAST will now be explained with reference to the process drawings (schematic cross-sectional views) of FIGS. 1 to 3.

FIG. 1 is a schematic cross-sectional view showing a step of forming a copper film on a silicon substrate. As shown in FIG. 1(a), an element 2 is formed at a prescribed location of the silicon substrate 1. Next, as shown in FIG. 1(b), a recess 3 for a through via is formed by a method such as plasma etching Next, copper is laminated by a method such as sputtering or electrolytic plating so as to fill the recess, to form a copper layer 4, thereby obtaining a substrate 100 having the structure shown in FIG. 1(c).

Figure 2:
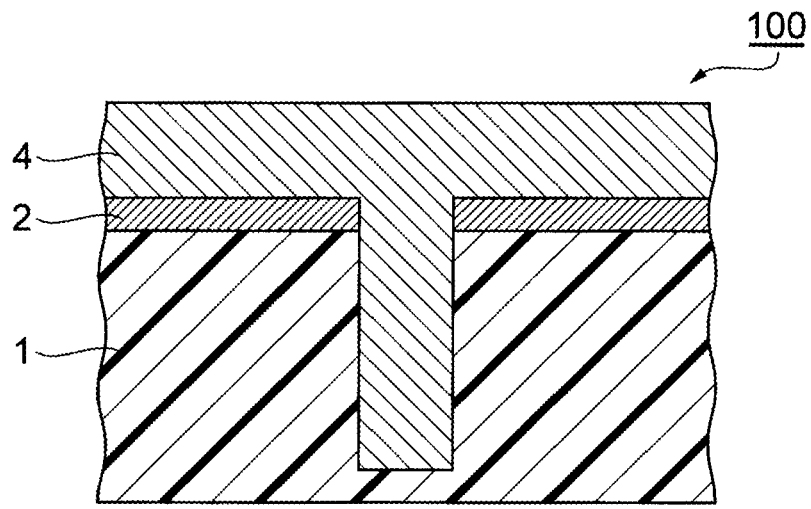
FIGS. 2(a)-(c) are second process drawings that illustrate a method of using a polishing agent of the invention for VIA-LAST.
Figure 2:
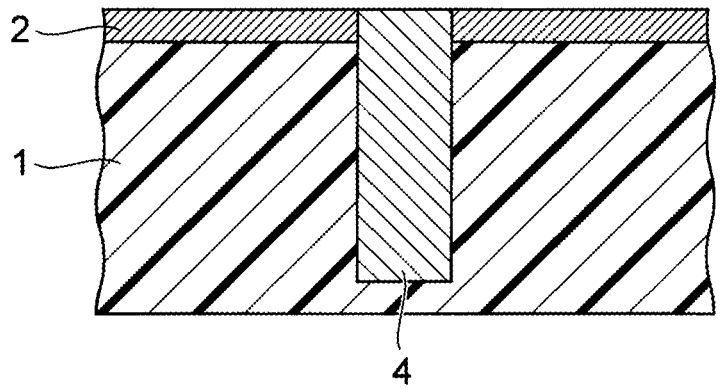
Figure 2:
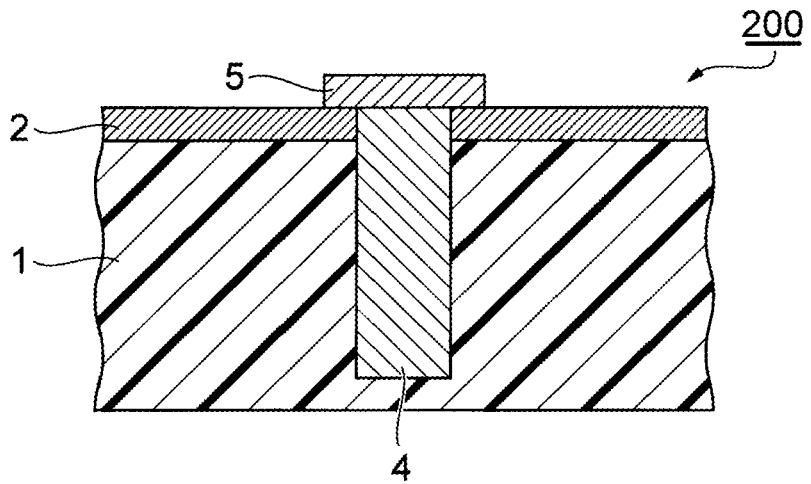

FIG. 2 is a schematic cross-sectional view showing a step of polishing a substrate 100 prepared in this manner and forming a bump on one side. The aforementioned polishing agent of the invention is supplied between the surface of the copper layer 4 in FIG. 2(a) and an abrasive pad (not shown), while the copper layer 4 is polished until the element 2 is exposed.

More specifically, the polishing agent of the invention is supplied between the copper layer 4 of the substrate 100 and the surface of the abrasive pad attached to the polishing platen, while the copper layer 4 is polished by relative movement between the polishing platen and the substrate 100 while in a pressed state. A metal or resin brush may be used instead of an abrasive pad. The polishing may also be accomplished by spraying the polishing agent at a prescribed pressure.

In the case of polishing with an abrasive pad, for example, the apparatus used for polishing may be a common polishing apparatus having a polishing platen that is connected to a motor or the like with variable rotational speed and that can mount the abrasive pad, and a holder capable of holding the substrate to be polished. There are no particular restrictions on the abrasive pad, and a common nonwoven fabric, foamed polyurethane, porous fluorine resin or the like may be used.

The polishing conditions are not restricted, but the rotational speed of the polishing platen is preferably no higher than 200 min$^{-1}$ to prevent fly off of the substrate. The pressure with which the substrate having the surface to be polished is pressed against the abrasive pad (polishing pressure) is preferably 1-100 kPa, and it is more preferably 5-50 kPa to satisfy the conditions of uniformity of CMP speed within the polishing plane, and flatness of the pattern. During the polishing, the polishing agent is continuously supplied to the abrasive pad with a pump or the like. The amount supplied is not particularly restricted, but preferably the surface of the abrasive pad is covered by the polishing agent at all times.

Upon completion of polishing, preferably the substrate is thoroughly rinsed in running water and spin drying or the like is used to remove the water droplets adhering to the substrate and to dry it. For CMP with a consistent surface condition of the abrasive pad, it is preferred to include an abrasive pad-conditioning step before polishing For example, the abrasive pad is conditioned with a solution containing at least water, using a dresser with diamond particles. A CMP polishing step is then carried out according to the invention, and preferably a substrate-washing step is added.

Next, as shown in FIG. 2(*c*), the exposed portion of the copper layer 4 is subjected to electrolytic plating or the like to form a bump 5, to obtain a substrate 200 having a bump on one side. The material of the bump may be copper or the like.

Figure 3:
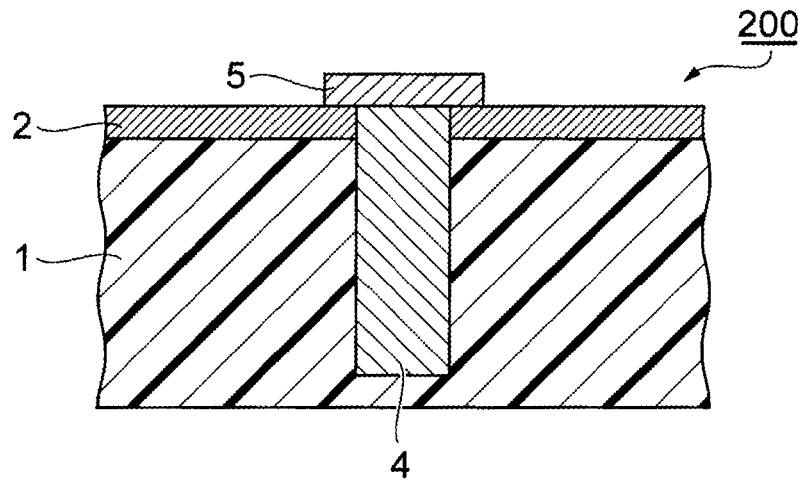
FIGS. 3(a)-(c) are third process drawings that illustrate a method of using a polishing agent of the invention for VIA-LAST.
Figure 3:
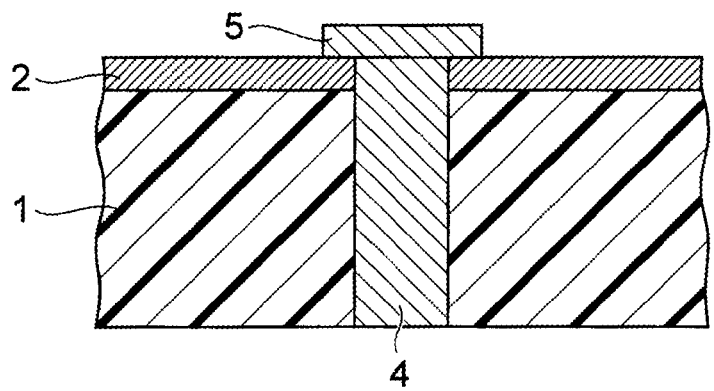
Figure 3:
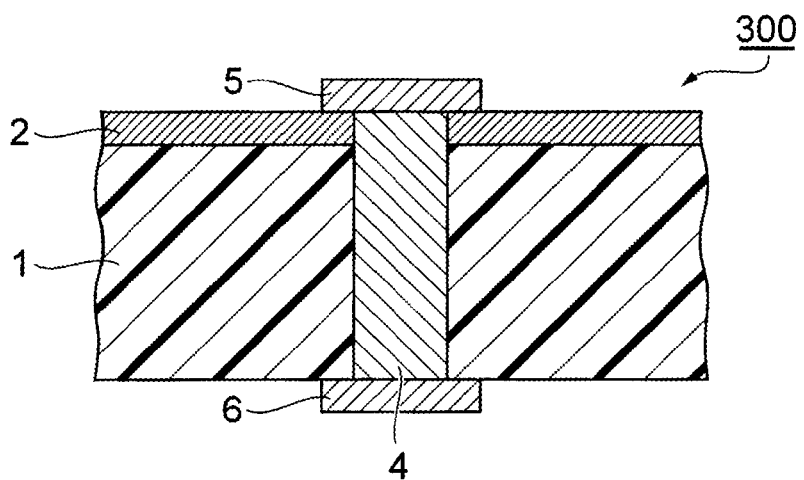

FIG. 3 is a schematic cross-sectional view showing a step of forming a bump on the other side. In the substrate 200 as shown in FIG. 3(*a*), the side on which the bump 5 is not formed is polished by a method such as CMP to expose the copper layer 4 (FIG. 3(*b*)). Next, a bump 6 is formed by the same method described above, to obtain a substrate 300 with a TSV formed thereon (FIG. 3(*c*)).

EXAMPLES

The present invention will now be explained in greater detail through the following examples, with the understanding that the invention is in no way limited by the examples.

(Preparation of Polishing Agents)

Example 1

To 550 g of water there were added 10 g of 96% sulfuric acid, 10 g of 85% phosphoric acid, 50 g of glycine, 10 g of benzotriazole (BTA), 10 g of oxalic acid and 50 g of colloidal silica with a mean particle size of 70 nm (solid content: 20%) prepared by hydrolysis of tetraethoxysilane in an ammonia solution, and the components other than colloidal silica were dissolved. There was further added 25% ammonia water to adjust the pH of the solution to 2.6, and then purified water was further added to a total amount of 700 g. To this there was added 300 g of hydrogen peroxide water (reagent grade, 30% aqueous solution) to obtain polishing agent 1 with a total mass of 1000 g.

Example 2

Polishing agent 2 was prepared in the same manner as Example 1, except that 10 g of malonic acid was added instead of oxalic acid.

Example 3

Polishing agent 3 was prepared in the same manner as Example 1, except that 10 g of maleic acid was added instead of oxalic acid.

Example 4

Polishing agent 4 was prepared in the same manner as Example 1, except that 50 g of alanine was added instead of glycine.

Example 5

Polishing agent 5 was prepared in the same manner as Example 1, except that 50 g of serine was added instead of glycine.

Example 6

Polishing agent 6 was prepared in the same manner as Example 1, except that the amounts of sulfuric acid and phosphoric acid added were 5 g each.

Comparative Example 1

Polishing agent X1 was prepared in the same manner as Example 1, except that no oxalic acid was added.

Comparative Example 2

Polishing agent X2 was prepared in the same manner as Example 1, except that no sulfuric acid or phosphoric acid was added, and the amount of oxalic acid was 30 g.

Comparative Example 3

Polishing agent X3 was prepared in the same manner as Example 1, except that no oxalic acid was added, and the amount of sulfuric acid was increased to 20 g.

Comparative Example 4

Polishing agent X4 was prepared in the same manner as Example 1, except that the amount of sulfuric acid added was 1 g, and the amount of phosphoric acid added was 5 g.

Comparative Example 5

Polishing agent X5 was prepared in the same manner as Example 1, except that malic acid was added instead of oxalic acid.

(Measurement of Neutralizing Titer)

Test solutions for measurement of neutralizing titer (test solutions 1 to 6 and test solutions X1 to X5) were prepared in the same manner as Examples 1 to 6 and Comparative Examples 1 to 5, except that no organic acid or 25% ammonia water was added. The neutralization titration equivalent for each test solution was measured with potassium hydroxide using a pH meter (Model PH81 by Yokogawa Electric Corp.), in a thermobath at 25° C. The obtained values are shown in Table 1 and Table 2. For Comparative Example 2, the pH exceeded 4.0 without addition of oxalic acid or ammonia water, and therefore the neutralizing titer was recorded as 0 (mol/kg).

The neutralization titration equivalent was determined in the following manner. Specifically, 50 milliliters of the test solution was placed in a 100 milliliter-volume beaker, aqueous potassium hydroxide at 20% concentration was added dropwise while stirring at 80 rpm with a stirrer, and the neutralization titration equivalent was calculated from the amount of aqueous potassium hydroxide added when the pH value reached 4.0.

(Polishing of Substrate)

A substrate (purchased from Advantech, Inc.) comprising a 20 μm-thick copper film formed on a silicon substrate with an 8-inch diameter (20.3 cm)(φ) was prepared. The substrate was used for CMP polishing while adding polishing agents 1 to 6 and polishing agents X1 to X5 dropwise to an abrasive pad attached to the platen of the polishing apparatus.

The polishing conditions were as follows.

Polishing apparatus: Platen dimensions of 600 mm(φ) diameter, rotary type.
Abrasive pad: Foamed polyurethane resin with closed cells (IC-1010, Rohm & Haas).
Polishing pressure: 32 kPa
Platen/head rotational speed: 93/87 rpm
Polishing agent flow rate: 200 ml/min (Evaluated Properties and Evaluation Methods)

The substrates polished as described above were used for measurement of the copper polishing speed by CMP (hereunder referred to simply as "polishing speed") and the surface roughness.

Polishing speed: The difference in film thickness before and after CMP of the substrate was determined in terms of the change in sheet resistance. The measuring apparatus used was a Model RT-7 resistivity meter by Napson Corp. The resistance value used was the average value of 77 points in the diameter direction of the wafer (excluding the sections 5 mm from the edges).

Surface roughness (arithmetic mean roughness: Ra): The surface roughness of the copper film after polishing was measured with an AFM (Atomic Force Microscope: SPA-400 by SII Nanotechnology, Inc.). The measurement was conducted at a location 50 mm distant from the center of the substrate in the radial direction, with an area range of 5 μm×5 μm.

The results are shown in Table 1 and Table 2.

TABLE 1

| | Example 1 | | Example 2 | | Example 3 | | Example 4 | | Example 5 | | Example 6 | |
|---|---|---|---|---|---|---|---|---|---|---|---|---|
| | Name | Addition (wt %) | Name | Addition (wt %) | Name | Addition (wt %) | Name | Addition (wt %) | Name | Addition (wt %) | Name | Addition (wt %) |
| Inorganic acid 1 | Sulfuric acid | 0.96 | Sulfuric acid | 0.96 | Sulfuric acid | 0.96 | Sulfuric acid | 0.96 | Sulfuric acid | 0.96 | Sulfuric acid | 0.48 |
| Inorganic acid 2 | Phosphoric acid | 0.85 | Phosphoric acid | 0.85 | Phosphoric acid | 0.85 | Phosphoric acid | 0.85 | Phosphoric acid | 0.85 | Phosphoric acid | 0.43 |
| Organic acid | Oxalic acid | 1.0 | Malonic acid | 1.0 | Maleic acid | 1.0 | Oxalic acid | 1.0 | Oxalic acid | 1.0 | Oxalic acid | 1.0 |
| Organic acid pKa1 | | 1.04 | | 2.65 | | 1.75 | | 1.04 | | 1.04 | | 1.04 |
| Amino acid | Glycine | 5.0 | Glycine | 5.0 | Glycine | 5.0 | Alanine | 5.0 | Serine | 5.0 | Glycine | 5.0 |
| Anticorrosion agent | BTA | 1.0 | BTA | 1.0 | BTA | 1.0 | BTA | 1.0 | BTA | 1.0 | BTA | 1.0 |
| Abrasive | Colloidal silica | 1.0 | Colloidal silica | 1.0 | Colloidal silica | 1.0 | Colloidal silica | 1.0 | Colloidal silica | 1.0 | Colloidal silica | 1.0 |
| Oxidizing agent | Hydrogen peroxide water | 9.0 | Hydrogen peroxide water | 9.0 | Hydrogen peroxide water | 9.0 | Hydrogen peroxide water | 9.0 | Hydrogen peroxide water | 9.0 | Hydrogen peroxide water | 9.0 |
| pH | | 2.6 | | 2.6 | | 2.6 | | 2.6 | | 2.6 | | 2.6 |
| Neutralizing titer (mol/kg) | | 0.28 | | 0.28 | | 0.28 | | 0.28 | | 0.28 | | 0.14 |
| Polishing speed (μm/min) | | 6.0 | | 5.4 | | 5.8 | | 5.4 | | 6.1 | | 4.0 |
| Surface roughness Ra (nm) | | 1.1 | | 1.1 | | 0.9 | | 1.0 | | 1.2 | | 1.2 |

BTA: Benzotriazole

TABLE 2

| | Comp. Ex. 1 | | Comp. Ex. 2 | | Comp. Ex. 3 | | Comp. Ex. 4 | | Comp. Ex. 5 | |
|---|---|---|---|---|---|---|---|---|---|---|
| | Name | Addition (wt %) | Name | Addition (wt %) | Name | Addition (wt %) | Name | Addition (wt %) | Name | Addition (wt %) |
| Inorganic acid 1 | Sulfuric acid | 0.96 | — | — | Sulfuric acid | 1.9 | Sulfuric acid | 0.096 | Sulfuric acid | 0.96 |
| Inorganic acid 2 | Phosphoric acid | 0.85 | — | — | Phosphoric acid | 1.7 | Phosphoric acid | 0.43 | Phosphoric acid | 0.85 |
| Organic acid | — | — | Oxalic acid | 3.0 | — | — | Oxalic acid | 1.0 | Malic acid | 1.0 |
| Organic acid pKa1 | | — | | 1.04 | | — | | 1.04 | | 3.24 |
| Amino acid | Glycine | 5.0 | Glycine | 5.0 | Glycine | 5.0 | Glycine | 5.0 | Glycine | 5.0 |
| Anticorrosion agent | BTA | 1.0 | BTA | 1.0 | BTA | 1.0 | BTA | 1.0 | BTA | 1.0 |
| Abrasive | Colloidal silica | 1.0 | Colloidal silica | 1.0 | Colloidal silica | 1.0 | Colloidal silica | 1.0 | Colloidal silica | 1.0 |
| Oxidizing agent | Hydrogen peroxide water | 9.0 | Hydrogen peroxide water | 9.0 | Hydrogen peroxide water | 9.0 | Hydrogen peroxide water | 9.0 | Hydrogen peroxide water | 9.0 |
| pH | | 2.6 | | 2.6 | | 2.6 | | 2.6 | | 2.6 |
| Neutralizing titer (mol/kg) | | 0.28 | | 0 | | 0.50 | | 0.07 | | 0.28 |

TABLE 2-continued

| | Comp. Ex. 1 | | Comp. Ex. 2 | | Comp. Ex. 3 | | Comp. Ex. 4 | | Comp. Ex. 5 | |
|---|---|---|---|---|---|---|---|---|---|---|
| | Name | Addition (wt %) | Name | Addition (wt %) | Name | Addition (wt %) | Name | Addition (wt %) | Name | Addition (wt %) |
| Polishing speed (μm/min) | | 3.5 | | 1.1 | | 3.7 | | 1.2 | | 3.7 |
| Surface roughness Ra (nm) | | 1.1 | | 1.4 | | 2.4 | | 1.3 | | 1.2 |

BTA: Benzotriazole

The following conclusions may be drawn from the results in Table 1 and Table 2. Specifically, the polishing agents of Examples 1 to 6 exhibited satisfactory polishing speed and surface roughness.

The polishing agent X1 of Comparative Example 1, having the composition of the polishing agent of Example 1 without oxalic acid, had a lower polishing speed while maintaining surface roughness, compared to Example 1.

The polishing agent X2 of Comparative Example 2, having the composition of the polishing agent of Example 1 with sulfuric acid and phosphoric acid replaced by oxalic acid, had a much lower polishing speed while maintaining surface roughness, compared to Example 1.

The polishing agent X3 of Comparative Example 3, having the composition of the polishing agent of Example 1 with sulfuric acid replaced by oxalic acid, had lower surface roughness and lower polishing speed compared to Example 1. Also, the polishing speed was higher than Comparative Example 1, but at a speed of below 4 μm/min.

Particularly as regards the polishing speed, a polishing speed of 6.0 μm/min was obtained with the polishing agent of Example 1, which was the system of Comparative Example 1 with addition of 1 wt % oxalic acid, whereas the polishing speed was no greater than 3.7 μm/min with the polishing agent of Comparative Example 3, which was the same as Comparative Example 1 with addition of 1 wt % sulfuric acid, and it was thus confirmed that combination of an inorganic acid and an organic acid is effective for increasing the polishing speed.

The polishing agent X4 of Comparative Example 4, which had a lower amount of inorganic acid compared to the polishing agent 1 of Example 1 and therefore a neutralization titration equivalent of below 0.10 mol/kg, exhibited much lower polishing speed than Example 1.

On the other hand, the polishing agent X5 of Comparative Example 5, which had the same type of inorganic acids and amounts of inorganic and organic acids as Example 1 but had an organic acid pKa of greater than 3, exhibited a lower polishing speed while maintaining surface roughness, compared to Example 1.

This indicates that optimizing the amounts and combinations of inorganic acids and organic acids can yield a polishing agent that exhibits a markedly higher polishing speed for copper than common polishing agents, while maintaining low surface roughness. In particular, a polishing agent with a polishing speed exceeding 4 μm/min and more preferably 5 μm/min for copper is optimal for use in polishing of large amounts of copper in a short time, for use in formation of TSVs, for example.

Explanation of Symbols

1: Silicon substrate, 2: element, 4: copper layer, 5, 6: bumps, 100, 200, 300: substrates.

The invention claimed is:

1. A polishing agent for copper which comprises a composition containing an inorganic acid, an amino acid, a protective film-forming agent, an abrasive, an oxidizing agent, an organic acid and water, adjusted to a pH of 1.5-4, wherein:
   the amount of potassium hydroxide required to raise the pH of the composition without the organic acid to 4 is at least 0.10 mol with respect to 1kg of the composition without the organic acid, and
   the organic acid contains at least two carboxyl groups, wherein the logarithm of the inverse of the first acid dissociation constant (pKa1) is no greater than 3; "wherein the protective film-forming agent is at least one protective film-forming agent selected from the group consisting of benzotriazole and its derivatives".

2. A polishing agent according to claim 1, wherein the organic acid is one or more organic acids selected from the group consisting of oxalic acid, maleic acid and malonic acid.

3. A polishing agent according to claim 1, wherein the inorganic acid includes one or more selected from among sulfuric acid and phosphoric acid.

4. A polishing agent according to claim 1, wherein the inorganic acid includes sulfuric acid and phosphoric acid.

5. A polishing agent according to claim 1, wherein the inorganic acid consists of sulfuric acid and phosphoric acid.

6. A polishing agent according to claim 1, wherein the pKa1 of the amino acid is 2-3.

7. A polishing agent according to claim 1, wherein the abrasive is colloidal silica and/or colloidal alumina having a mean particle size of no greater than 100 nm.

8. A polishing agent according to claim 1, wherein the oxidizing agent is at least one oxidizing agent selected from the group consisting of hydrogen peroxide, persulfuric acid and persulfuric acid salts.

9. A polishing method comprising a lamination step in which a copper-containing metal film is laminated on a substrate, and a polishing step in which a polishing agent according to claim 1 is used for polishing of the copper-containing metal film to remove a portion of the metal film.

10. The polishing method according to claim 9, wherein the maximum thickness of the metal film is 5 μm or greater.

11. The polishing method according to claim 9, wherein the maximum thickness of the metal film is 10 μm or greater.

12. The polishing method according to claim 9, wherein the polishing speed for polishing of the metal film in the polishing step is 5 μm/min or greater.

13. The polishing method according to claim 9, wherein the metal film is a copper film.

* * * * *